United States Patent [19]

Aihara et al.

[11] 4,101,838
[45] Jul. 18, 1978

[54] CLOCK PULSE GENERATING APPARATUS

[75] Inventors: Mitsuo Aihara, Tokyo; Tsuneo Takase; Tetsuo Yamaguchi, both of Yokohama, all of Japan

[73] Assignee: Tokyo Shibaura Electric Co., Ltd., Tokyo, Japan

[21] Appl. No.: 762,714

[22] Filed: Jan. 26, 1977

[30] Foreign Application Priority Data

Jan. 28, 1976 [JP] Japan .................................. 51-8135

[51] Int. Cl.² .......................... H03K 3/72; H03K 1/16
[52] U.S. Cl. ........................................ 328/63; 328/48; 58/23 R; 58/23 AC; 331/16; 331/51; 307/269
[58] Field of Search .............................. 328/48, 49, 63; 58/23 R, 23 AC, 85.5; 331/16, 17, 51, 48; 307/269

[56] References Cited

U.S. PATENT DOCUMENTS

| | | | |
|---|---|---|---|
| 3,192,478 | 6/1965 | Metz ................................. | 328/48 X |
| 3,729,623 | 4/1973 | Kelling ............................ | 328/63 X |
| 3,952,254 | 4/1976 | Kurita et al. .......................... | 328/63 |
| 3,978,649 | 9/1976 | Naito .................................... | 58/23 R |
| 3,988,597 | 10/1976 | Yamaguchi ....................... | 58/23 R X |
| 4,009,445 | 2/1977 | Hasegawa .......................... | 328/48 X |

*Primary Examiner*—John S. Heyman
*Attorney, Agent, or Firm*—Finnegan, Henderson, Farabow & Garrett

[57] ABSTRACT

A clock pulse generating apparatus comprises a pulse generator for generating a pulse signal of a predetermined cycle, a frequency divider including a plurality of frequency division stages for frequency dividing an output pulse from the pulse generator, a circuit for subtracting at a predetermined ratio the number of clock pulses passing through a given frequency division stage in the frequency divider, a pulse control circuit including an external operation terminal for variably adding the number of pulses passing through another frequency division stage in the frequency divider, and a timing setting circuit for imparting a pulse subtracting timing and pulse adding timing to the pulse subtracting circuit and pulse control circuit, respectively.

11 Claims, 7 Drawing Figures

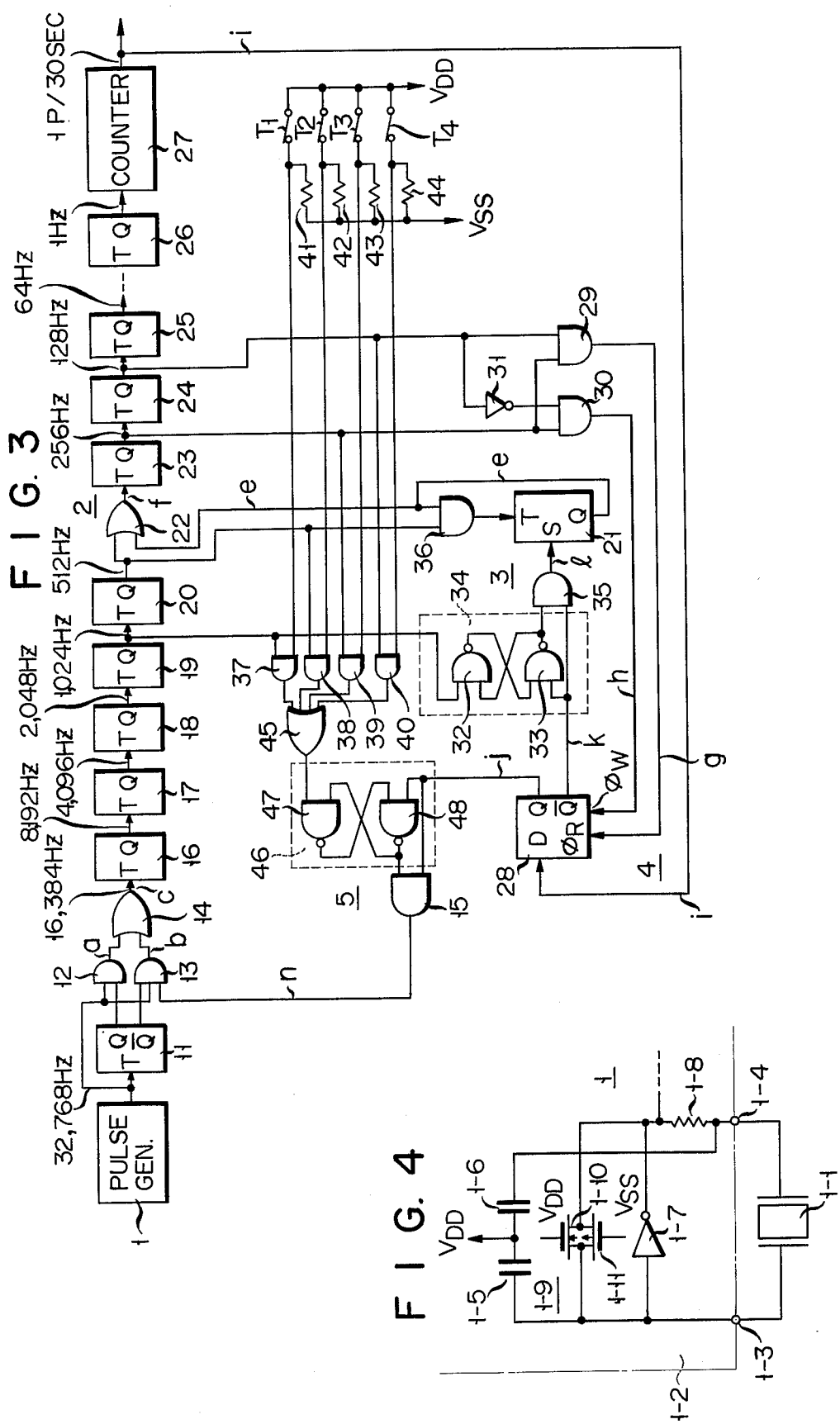

CLOCK PULSE GENERATING APPARATUS

This invention relates to a clock pulse generating apparatus particularly suitable for an electronic timepiece.

The frequency of a clock pulse of an electronic timepiece, frequency divider etc. is conventionally adjusted by varying an oscillation frequency at an oscillator. An oscillator using a quartz oscillator element, for example, the frequency adjustment is effected by varying the capacitance of an external capacitor which constitutes together with the quartz oscillator element a filter. In such a device, a capacitor is externally provided with respect to an integrated circuit constituting an oscillator. Furthermore, matching is effected between the quartz oscillator element and the capacitor and the frequency trimming is effected by using a trimmer capacitor, thus complicating the assembly process of the electronic timepiece. This also provides a bar to the miniaturization of the timepiece, since a capacitor receiving space is required in the casing of the timepiece. Moreover, since the capacitance of the capacitor is restricted from the standpoint of a spacing, the range of a frequency which can be varied by a change of a capacitor is very limited and in consequence use may be made of only a quartz oscillator element having a restricted resonance frequency. The resonance frequency of the quartz oscillator element can not accurately set during the manufacturing time and in consequence it is necessary to select, after manufacture, a quartz oscillator element having a resonance frequency range suitable for use.

It is accordingly an object of this invention to provide a readily manufacturable, compact clock pulse generating apparatus which can readily provide a wide range of frequency compensation and can obtain a high accuracy clock pulse.

According to this invention there is provided a clock pulse generating apparatus comprising a pulse generator for generating a pulse signal of a predetermined cycle, a frequency divider including a plurality of frequency division stages for frequency dividing an output pulse from the pulse generator, pulse subtracting means for subtracting at a predetermined ratio the number of pulses passing through a given frequency division stage in the frequency divider, pulse adding means for adding at a predetermined ratio the number of pulses passing through another frequency division stage in the frequency divider, timing setting means for giving an operating timing to the pulse subtracting means and pulse adding means, and control means including at least an external operating terminal for variably controlling at least one of the pulse subtracting means and pulse adding means.

This invention can be more fully understood from the following detailed description when taken in conjunction with the accompanying drawing, in which:

FIG. 3 is a block circuit diagram showing a detail of the embodiment in FIG. 1;

FIG. 4 is a circuit diagram showing a detail of a pulse generator in FIG. 3;

Figure 1:
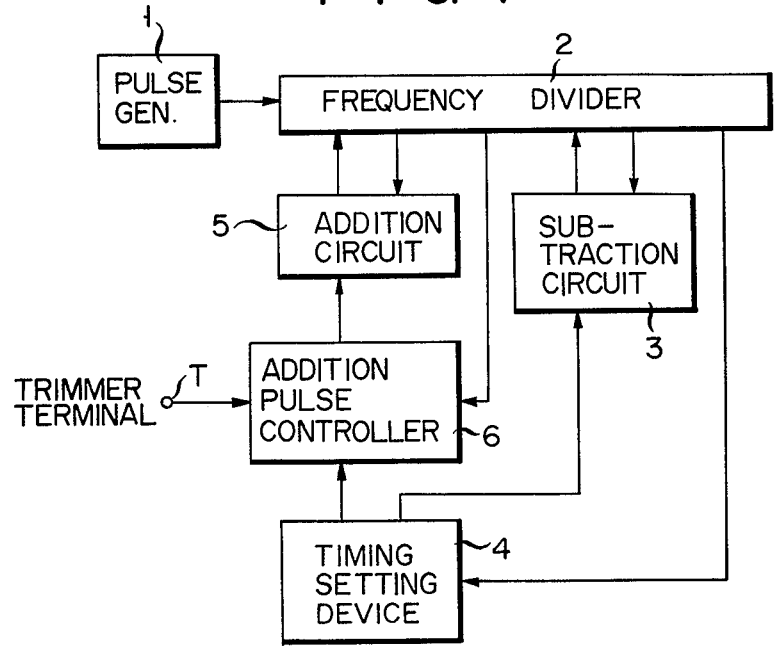
FIG. 1 is a block diagram showing a clock pulse generating apparatus according to one embodiment of this invention.

In FIG. 1 a pulse generator 1 using a quartz oscillator delivers a pulse output of, for example, 32,768 Hz to a frequency divider 2. The frequency divider 2 comprises a plurality of frequency division stages made of, for example, flip-flops connected in a multi-stage configuration, and the output of the pulse generator 1 is sequentially frequency divided at the frequency division stages of the frequency divider 2. A clock pulse subtraction circuit 3 is adapted to subject clock pulses of a given frequency division stage in the frequency divider 2 to subtraction at a fixed ratio upon receipt of a pulse subtraction timing output signal of a timing setting circuit 4. The timing setting circuit 4 is adapted to generate upon receipt of the output of the frequency divider 2 a pulse for providing a pulse subtraction timing to the subtraction circuit 3 and a pulse for providing a pulse addition timing to a clock pulse addition circuit 5. An addition pulse generator 6 is adapted to control the ratio of pulse addition at the addition circuit 5 upon receipt of an adjustment input from a trimmer terminal T. The clock pulse addition circuit 5 is adapted to variably increase the number of clock pulses of a given frequency division stage of the frequency divider 2 during an addition time adjusted at the addition controller circuit 6. The number of output pulses from the frequency divider 2 is increased when the value of the addition ratio is greater than that of the subtraction ratio, and decreased when the value of the addition ratio is smaller than that of the subtraction ratio. When it is used in an electronic timepiece, it gains when the number of pulses is increased and loses when the number of pulses is decreased.

Figure 2:
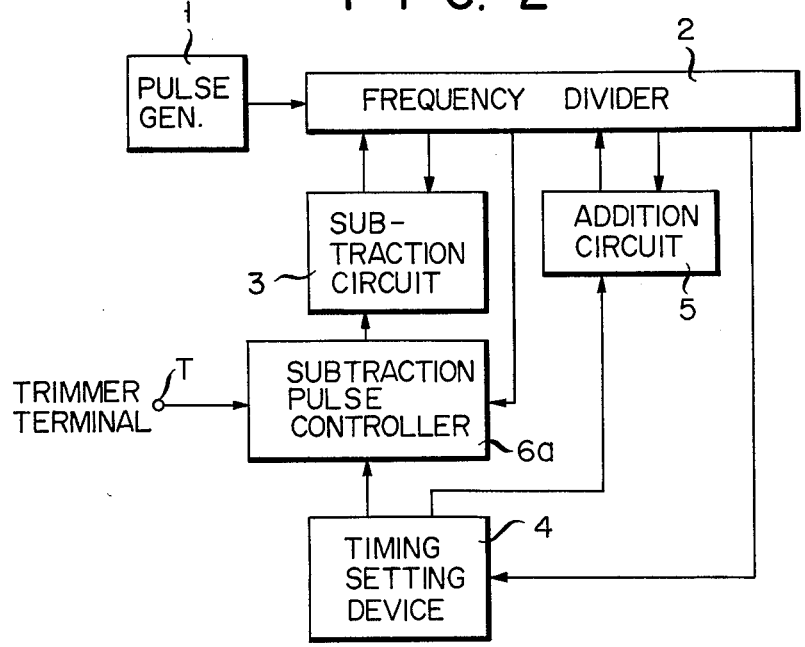
FIG. 2 is a block diagram showing a clock pulse generating apparatus according to another embodiment of this invention.

In the embodiment shown in FIG. 1 the addition circuit 5 is designed that a pulse addition is variably effected, at a ratio greater than that of a pulse subtraction, under the condition that the number of clock pulses is subjected to subtraction at a fixed ratio. However, the same result can be obtained when the ratio of a pulse subtraction is variably adjusted under the condition that the ratio of a pulse addition is fixed. FIG. 2 shows another embodiment of this invention which is based on the latter concept. The same reference numerals are employed in FIG. 2 to designate sections corresponding to those shown in FIG. 1. In the arrangement shown in FIG. 2 a clock pulse addition circuit 5 is adapted to increase at a fixed ratio the number of clock pulses of a given frequency division stage in a frequency division device 2 in receipt of a pulse addition timing output signal of a timing setting circuit 4. A subtraction pulse controller 6a is adapted to control a pulse subtraction ratio at a subtraction circuit 3 in receipt of an adjustment input from a trimmer terminal T. The clock pulse subtraction circuit 3 is adapted to variably decrease the number of clock pulses of a given frequency division stage in the frequency divider 2 during a subtraction time period adjusted at a subtraction pulse controller.

The embodiment shown in FIG. 1 will be further explained by referring to FIG. 3.

The pulse generator 1 generates an output pulse of 32,768 Hz which in turn is supplied to a set terminal of a T-type flip-flop 11 and to one input terminal of each of AND gates 12 and 13. Since no frequency adjustment is required at the side of the pulse generator 1, the pulse generator 1 can be constructed, for example, as shown in FIG. 4. In FIG. 4, reference numeral 1—1 is a quartz oscillator element connected to terminals 1-3 and 1-4 of a semiconductor integrated circuit 1-2. In the semiconductor integrated circuit 1-2, a pair of capacitors 1-5 and 1-6 are serially connected between the terminals 1-3 and 1-4 of the semiconductor integrated circuit 1-2. The capacitors 1-5 and 1-6 constitute, together with the quartz oscillator element 1—1, a filter. Between the terminals 1-3 and 1-4 are serially connected an output resistor 1-8 and an oscillation stage amplifier 1-7 which functions as an inverter. The oscillation stage amplifier 1-7 is materialized by an inverter made of, for example, a complementary MOS transistor. Reference numeral 1-9 is a feedback resistor connected between the input and output terminals of the amplifier 1-7. In the feedback resistor 1-9 an N-channel MOS type FET 1-10 and P-channel MOS type FET 1-11 are connected in parallel with each other and a power source $V_{DD}$ is applied to the gate of the N-channel MOS type FET 1-10 and a power source $V_{SS}$ to the gate of the P-channel MOS type FET 1-11. The output pulse of the pulse generator 1 is taken out across an output resistor 1-8.

Referring back to FIG. 3, 16,384 Hz Q and $\overline{Q}$ outputs of the T-type flip-flop 11 are supplied to the other terminals of the AND gates 12 and 13, respectively. An output $a$ of the two input terminal AND gate 12 is supplied to one input terminal of an OR gate 14 and an output $n$ of an AND gate 15 in the pulse addition circuit is supplied, as will later be described, to the remaining input terminal of the three input terminal AND gate 13. The output of the AND gate 13 is supplied to the other input terminal of the OR gate 14 and the output of the OR gate 14 is delivered to the set terminal of a frequency division stage flip-flop 16 in the frequency divider 2. An 8,192 Hz output of the flip-flop 16 is supplied to the set terminal of a next frequency division stage flip-flop 17 where it is frequency divided into 4,096 Hz. The 4,096 Hz output of the flip-flop 17 is coupled to a next succeeding stage flip-flop 18 where it is frequency divided into 2,048 Hz. The 2,048 Hz output of the flip-flop 18 is coupled to a next succeeding stage flip-flop 19 where it is frequency divided into 1,024 Hz and the 1,024 Hz output of the flip-flop 19 is coupled to a next succeeding stage flip-flop 20 where it is frequency divided into 512 Hz.

The 512 Hz output pulse of the flip-flop 20 is supplied, together with the Q output $e$ of a flip-flop 21 in the pulse subtraction circuit 3, to an OR gate 22. The 512 Hz output of the OR gate 22 is frequency divided at a flip-flop 23 into 256 Hz which in turn is frequency divided at a flip-flop 24 into 128 Hz. The 128 Hz output of the flip-flop 24 is frequency divided at a flip-flop 25 into 64 Hz. Such a frequency division is repeated until a 1 Hz output is obtained at a flip-flop 26. In this way, a one pulse per second signal is obtained from the flip-flop 26. The output pulse of the flip-flop 26 is supplied to a scale-of-30 counter 27 from where one carry signal $i$ per 30 seconds is outputted.

The carry signal $i$ is supplied to a D terminal of a delay type flip-flop 28 in the timing setting device 4 and to a binary counter, not shown, where a one pulse per minute signal is obtained. The delay type flip-flop 28 has a read-in terminal $\phi_R$ and readout terminal $\phi_W$ which are coupled to the output terminals of AND gates 29 and 30, respectively. The input terminal of the AND gate 29 is coupled to the output terminals of flip-flops 23 and 24 which generates 256 Hz and 128 Hz outputs, respectively. The input terminal of the AND gate 30 is connected to the output terminal of the flip-flop 23 and to the output terminal of an inverter 31. The input terminal of the inverter 31 is coupled to the output terminal of the flip-flop 24. The output of the AND gate 29 is supplied as a read-in pulse $g$ to the $\phi_R$ terminal of the D type flip-flop 28 and the output of the AND gate 30 is supplied as a readout pulse $h$ to the readout terminal $\phi_W$ of the D-type flip-flop 28.

A Q output $k$ of the D type flip-flop 28 is supplied, together with the output of an S-R flip-flop 34 constituted of NAND gates 32 and 33, to an AND gate 35. One input terminal of the NAND gate 32 constitutes one input terminal of the S-R flip-flop 34 and is coupled to the flip-flop 19 which generates a 1,024 Hz output. One input terminal of the NAND gate 33 constitutes the other input terminal of the S-R flip-flop 34 and is connected to the $\overline{Q}$ output terminal of the flip-flop 28. The other input terminal of the NAND gate 32 is coupled to the output terminal of the NAND gate 33 and the output terminal of the NAND gate 32 is connected to the other input terminal of the NAND gate 33. An output $l$ of the AND gate 35 is coupled to the set terminal of the flip-flop 21 and a Q output $e$ of the flip-flop 21 is connected to one input terminal of the OR gate 22 and to one input terminal of an AND gate 36. The 512 Hz output of the flip-flop 20 is connected to the other input terminal of the AND gate 36 and the output of the AND gate 36 is coupled to a reset terminal of the flip-flop 21.

The 1,024 Hz, 512 Hz, 256 Hz and 128 Hz outputs of the flip-flops 19, 20, 23 and 24 are connected to the input terminals of AND gates 37, 38, 39 and 40, respectively. The remaining input terminals of the AND gates 37, 38, 39 and 40 are respectively connected to the terminals of switches $T_1$, $T_2$, $T_3$ and $T_4$ and to the terminals of resistors 41, 42, 43 and 44. The opposite terminals of the switches $T_1$ to $T_4$ are connected to the low level source $V_{DD}$ and the opposite terminals of the resistors 41, 42, 43 and 44 is connected to a $V_{SS}$ high level power source. The switches $T_1$ to $T_4$ are normally closed and in consequence no gate signals are applied to the remaining input terminals of the AND gates 37 to 40. The output terminals of the AND gates 37 to 40 are coupled to the input terminals of an OR gate 45 and the output terminal of the OR gate 45 is connected to one input terminal of an NAND gate 47 which constitutes together with a NAND gate 48 an S-R flip-flop 46. The other input terminal of the NAND gate 47 is connected to the output terminal of the NAND gate 48 and the output terminal of the NAND gate 47 is coupled to one input terminal of the NAND gate 48. The other input terminal of the NAND gate 48 is coupled to the Q output terminal of the D-type flip-flop 28 and to one input of the AND gate 15. The output terminal of the NAND gate 48 is connected to the other input terminal of the AND gate 15.

Figure 5:
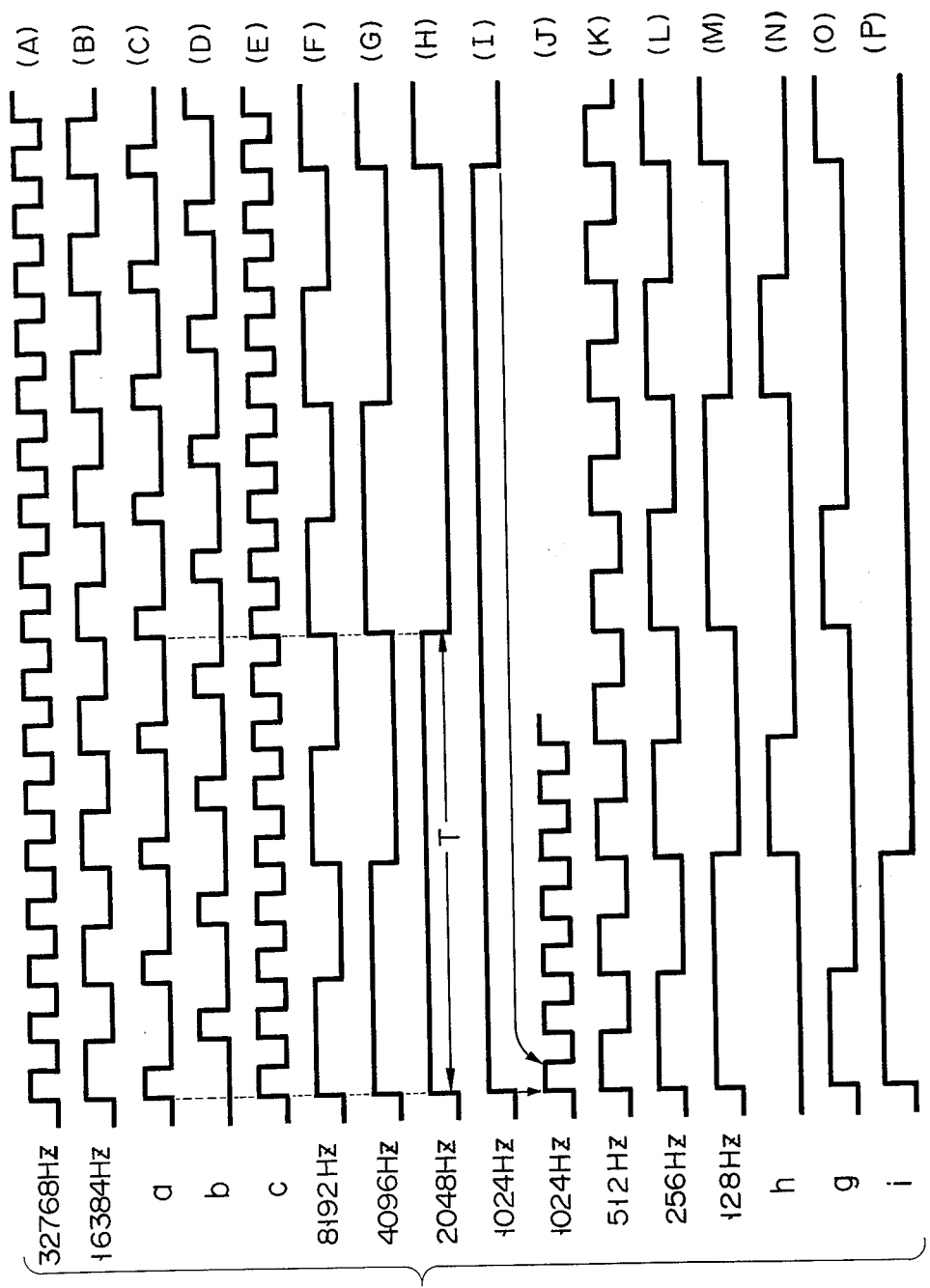
FIGS. 5 and 6 are signal waveformes for explaining the operation of the circuit in FIG. 3.
Figure 6:
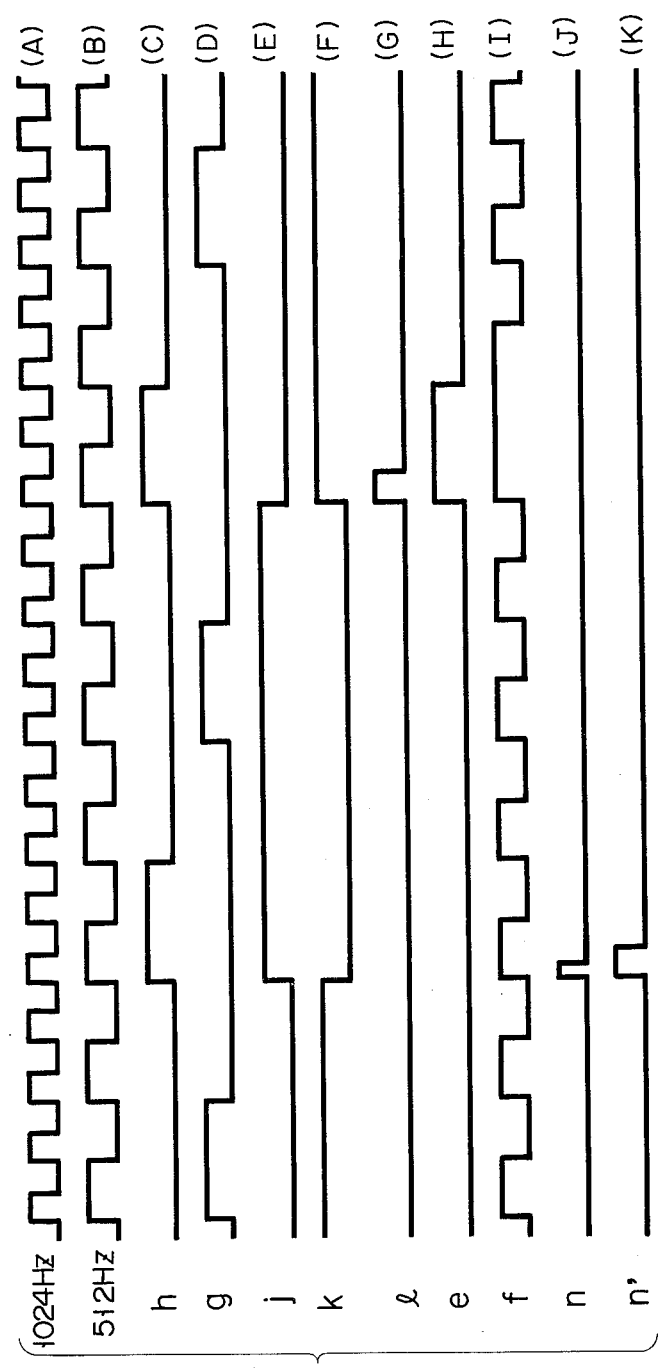

The operation of the clock pulse generating apparatus in FIG. 3 will now be explained by referring to FIGS. 5 and 6.

The pulse generator 1 generates, for example, a 32,768 Hz pulse having a duty of 50% (as shown in a waveform in FIG. 5(A)) is frequency divided at the flip-flop 11 into 16,384 Hz. The output of the flip-flop 11 is converted into a pulse waveform as shown in FIG. 5(B). The Q output, not shown, is polarity-inverted $\overline{Q}$ output. The flip-flop 11 is operated in synchronism with a rise of an input to its T terminal and the remaining flip-flops in FIG. 3 are all operated in synchronism with a rise of an input to their T terminal. Since pulses shown in FIGS. 5(A) and 5(B) are supplied to the AND gate 12, the output $a$ becomes a pulse which is in synchronism with the rise of a positive 16,384 Hz pulse. The output of the pulse generator 1 and the Q output of the flip-flop 11 are supplied, together with the output $n$ of the AND gate 15, to the AND gate 13 and, if only the output $n$ of the AND gate 15 in the "1" level, the output $b$ of the AND gate 13 becomes a pulse as shown in FIG. 5(D) which is in synchronism with a fall of a negative 16,384 Hz pulse. When the output $n$ of the AND gate 15 is "0", no output appears from the AND gate 13 and only the 16,384 Hz output $a$ of the AND gate 12 is supplied through the OR gate 14 to the T-type flip-flop 16. When the output $n$ of the AND gate 13 is in the "1" level, i.e., the output of the addition circuit 5 is in the "1" level the outputs $a$ and $b$ of the AND gates 12 and 13 are supplied to the OR gate 14, the output $c$ of the OR gate 14 becomes a 32,768 Hz pulse as shown in FIG. 5(E). That is, when the output $n$ of the AND gate 15 is in the "1" level an input frequency to the flip-flop 16 be doubled and the number of the clock pulses is increased according to the period.

When the output $n$ of the AND gate 15 is in the "0" level the 16,384 Hz pulse is frequency divided into an 8,192 Hz pulse as shown in FIG. 5(F). Such a frequency division is sequentially effected at the flip-flops 17, 18, 19 and 20 to obtain synchronizing pulses as shown in FIG. 5(G), (H), (I), (J) and (K). The pulse signals shown in FIGS. 5(I) and 5(J) are both 1,024 Hz. To illustrate a pulse signal having a frequency of below 1,024 Hz, a pulse cycle shown in FIG. 5(I) is shown as being reduced in scale in FIG. 5(J). The 512 Hz output of the flip-flop 20 is converted through the OR gate 22 to the flip-flop 23 where a 256 Hz output pulse is obtained as shown in FIG. 5(L). The output of the flip-flop 23 is converted at the flip-flop 24 into a 128 Hz output as shown in FIG. 5(M) which in turn is converted at the flip-flop circuit 25 into a 64 Hz pulse.

The 256 Hz pulse of the flip-flop 23 and the 128 Hz pulse inverted at the inverter 31 are supplied to the AND gate 30 of the timing setting device 4 and a 128 Hz pulse output $h$ as shown in FIG. 5(N) is obtained from the AND circuit 30. The output $h$ of the AND circuit 30 is delivered to the $\phi_W$ terminal of the D-type flip-flop 28. A 128 Hz output as shown in FIG. 5(D) which is in synchronism with the rise of the 256 Hz pulse and 128 Hz pulse is obtained from the AND gate 29. The output $g$ of the AND gate 29 is supplied to the $\phi_R$ terminal of the flip-flop 28.

A one carry per 30 seconds signal $i$ as shown in FIG. 5(P) is delivered from the scale-of-30 counter 27 to the D terminal of the flip-flop 28. When the signal $h$ as shown in FIG. 6(C) is applied to the readout terminal $\phi_W$ under the condition that the signal $i$ is being applied to the D terminal of the flip-flop 28, polarity-reversed outputs $j$ and $k$ as shown in FIG. 6(E) and FIG. 6(F) are generated from the flip-flop 28. It is to be noted that the relative relation of the 1,024 Hz and 512 Hz pulses and signals as shown in FIGS. 5(A) to (D) is the same as the signals as shown in FIGS. 5(J), 5(K), 5(N) and 5(O).

Suppose that the output $k$ as shown in FIG. 6(F) is generated from the flip-flop 28. If upon shifting the output $k$ from the level "0" to the level "1" a positive 1,024 Hz input is applied to the input terminal of the NAND gate 32 in the S-R flip-flop 34 an output pulse $l$ as shown in FIG. 6(G) appears from the AND gate 35 to cause the flip-flop 21 to be set. As a result, the Q output $e$ of the flip-flop 21 rises as shown in FIG. 6(H). The output $e$ is supplied to the OR gate 22, prohibiting a supply of the 512 Hz pulse from the flip-flop 20 to the flip-flop 23 as shown in FIG. 6(I). The flip-flop 21 is reset by a rise of a 512 Hz pulse first supplied to the AND gate 36 after it is set, and thereafter the 512 Hz is supplied directly to the flip-flop 23 without being subjected to subtraction at the OR gate 22. Since as shown in FIG. 6(G) a signal $l$ sets the flip-flop 21 at the rate of once per 30 seconds, the 512 Hz of the flip-flop 20 is prohibited at the rate of once per 30 seconds, i.e., subjected to subtraction. In consequence, the ratio of a delay of the clock pulse will be $$\frac{1}{512 \times 30} \doteq 65 \text{ PPM (parts per million)}$$

When in this state the external trimmer switches $T_1$ to $T_4$ are all in the ON state the outputs of the AND gates 37 through 40 are all at the "0" level and the output $n$ of the AND gate 15 is at the "0" level. At this time the input $b$ of the OR gate 14 is always at the "0" level and no input $b$ is added to the output C. As a result, the optut pulse of the pulse generator 1 is delayed by 65 PPM in the frequency divider 2 due to the presence of the subtraction circuit 3.

When only the external trimmer switch $T_1$ is opened, the gate of the AND gate 37 is opened and a 1,024 Hz pulse of the flip-flop 18 is supplied through the OR gate 45 to the S-R flip-flop 46. That is, when the Q output $j$ of the flip-flop 28 as shown in FIG. 6(E) rises and at the same time the 1,024 Hz pulse as shown in FIG. 6(A) rises, an output $n$ having a pulse width corresponding to one half the width of the 1,024 Hz pulse (i.e., 2 pulse width of 1/4096 sec., 2048 Hz 50% duty) is obtained as shown in FIG. 6(J). The 3048 Hz pulse has a cycle as shown in FIG. 5(H) and in consequence the AND gate 13 is opened only when the positive pulse portion T of the 2,048 Hz appears. During the period T, four pulses $b$ as shown in FIG. 5(D) are added to the pulse $a$ at the OR gate 14. That is, the four pulses $b$ per 30 seconds are added to the 16,384 pulse $a$, the output clock pulse of the pulse generator 1 gains by $$\frac{4}{16,384 \times 30} \doteq 8 \text{ PPM.}$$

When it is synthesized together with a delay of the subtraction circuit 3

$$-65+8 = -57 \text{ PPM}$$

As a result, a delay of 57 PPM is obtained.

When only the external trimmer switch $T_2$ is opened, only the AND gate 32 is opened and the 512 Hz pulse is supplied to the S-R flip-flop 46. In consequence, a signal $n'$ having a pulse width corresponding to double the width of the signal $n$ as shown in FIG. 6(J) is obtained from the AND gate 15. Since a pulse $b$ is added at the rate of 8 per 30 seconds, the clock output pulse of the pulse generator1 gains by $$\frac{8}{16384 \times 30} \doteq 16 \text{ PPM}$$

As a result, a delay $(-65+16 = -49)$ 49 PPM is obtained. In this way, $2^4 = 16$ kinds of additions are obtained by a combination of ON and OFF of the external trimmer switches $T_1$ to $T_4$. A maximum pulse addition is effected when the switches $T_1$ to $T_4$ are all opened. At this time, an addition of $$\frac{4 \times (1 + 2 + 4 + 8)}{16384 \times 30} \doteq 122 \text{ PPM}$$

is effected. When it is synthesized together with a fixed delay of $-65$ PPM, an addition of $-65+122 = 57$ PPM is effected. The following Table shows a ratio of addition (gain) and subtraction (loss) after synthesies, as obtained by a combination of the trimmer switches $T_1$ to $T_4$. Since the carry signal $i$ of the scale-of-30 counter 27 is subjected to an influence of a pulse subtraction and addition at the subtraction circuit 3 and addition circuit 5, the value $\epsilon$ of PPM in the following Table somewhat differs. However, such an error is of the order of $10^{-10}$ to $10^{-12}$ PPM and can be disregarded.

Table

| $T_1$ | $T_2$ | $T_3$ | $T_4$ | $\epsilon$(PPM) |
|---|---|---|---|---|
| 0 | 0 | 0 | 0 | $-65$ |
| 1 | 0 | 0 | 0 | $-57$ |
| 0 | 1 | 0 | 0 | $-49$ |
| 1 | 1 | 0 | 0 | $-41$ |
| 0 | 0 | 1 | 0 | $-33$ |
| 1 | 0 | 1 | 0 | $-24$ |
| 0 | 1 | 1 | 0 | $-16$ |
| 1 | 1 | 1 | 0 | $-8$ |
| 0 | 0 | 0 | 1 | 0 |
| 1 | 0 | 0 | 1 | 8 |
| 0 | 1 | 0 | 1 | 16 |
| 1 | 1 | 0 | 1 | 24 |
| 0 | 0 | 1 | 1 | 33 |
| 1 | 0 | 1 | 1 | 41 |
| 0 | 1 | 1 | 1 | 49 |
| 1 | 1 | 1 | 1 | 57 |

Although the clock pulse is corrected at intervals of 8 PPM over a range from $-65$ PPM to $+59$ PPM, these values are arbitarily determined by suitably selecting input pulses $g$, $h$, $i$ to the flip-flop 28, input clock pulse frequency to the AND gates 37 through 40, the number of trimmer switches and so on.

Figure 7:
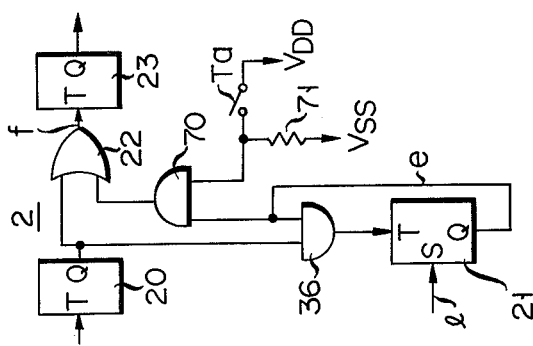
FIG. 7 is a circuit diagram showing a modified circuit for subtracting the number of pulses shown in FIG. 3.

As has been described above, the flip-flop 21 is set at a rate of once per 30 seconds and then the output $e$ of the Q terminal of the flip-flop 21 is supplied to the input of the OR gate 22. As a result, the number of the clock pulses sent to the flip-flop 23 from the flip-flop 22 is decreased at a predetermined rate. Further, this pulse number decreasing operation may also be controlled by means of an external operation switch means. FIG. 7 shows one example of such a circuit for controlling the pulse number decreasing operation, in which one input terminal of the OR gate 22 is connected to an output terminal of an AND gate 70 having one input terminal connected to the Q output terminal of the flip-flop 21 and to one input terminal of the AND gate 36. The other input terminal of the AND gate 70 is connected to one end of a resistor 71 and to one terminal of an external operating switch Ta. The other terminals of the resistor 71 and switch Ta are connected to the $V_{SS}$ source terminal and the $V_{DD}$ source terminal, respectively.

The operation of the circuit of FIG. 7 is now described. First, when the external operating switch Ta is opened as shown in FIG. 7, the voltage $V_{SS}$ of the "1" level is applied to the one input terminal of the AND gate 70 through the resistor 71 to open the AND gate 70. In this state, the output $e$ from the Q output of the flip-flop 21 is supplied to one input terminal of the OR gate 22 and the pulse number of the subtraction circuit 3 is executed at a rate of once per 30 seconds.

On the other hand, when the external operating switch Ta is closed, the level at the one input terminal of the AND gate 70 becomes the ground or "0" level to close the gate 70. As a result, the output $e$ of the flip-flop 21 is not supplied to the OR gate 22. Accordingly, at this time, the number of the clock pulses sent to the flip-flop 23 from the flip-flop 22 is not decreased.

By using the circuit shown in FIG. 7, the rate of the pulse number subtraction can freely be controlled by means of the external operating switch at any desired time, thereby further enlarging the range of the frequency compensation of the clock pulse generating apparatus of this invention.

According to this invention the following advantages are obtained.

Since a clock pulse of a given frequency division stage in the frequency divider is subjected to subtraction and a clock pulse of another frequency division stage in the frequency divider is subjected to addition, the oscillation frequency can be corrected either in the gain direction or in the loss direction. Since it is unnecessary to adjust the oscillation frequency of the oscillator per se, the capacitance of the capacitor is not required to be minutely adjusted unlike a conventional clock pulse generating apparatus. The apparatus obviates the necessity of considering matching between the quartz oscillator element and the capacitor and it is also unnecessary to use a trimmer capacitor. The frequency accuracy is improved. Since no increase of an input and output capacity due to the tuning of the oscillator is involved, no adverse influence is imparted to the oscillation characteristic such as an oscillation drive voltage etc. The oscillator requires no greater accuracy with respect to the capacitance of the capacitor and in consequence the capacitor can be integrally incorporated in the integrated circuit, particularly contributing much to the simplification of the assembling step of an electronic timepiece and the minuaturization of the timepiece. The frequency to be corrected can be aribitarily set over a wider range and a quartz oscillator element having a relatively wide range of resonance frequency can be used, leading to the simplification of the manufacture of the quartz oscillator element and the lowering of a manufacturing cost. Since in the embodiment shown in FIG. 3 an input to the timing setting device is taken out of the frequency divider 2, no particular pulse generator is required, permitting the circuit arrangement to be very simplified.

What we claim is:

1. A clock pulse generating apparatus comprising a pulse generator for generating a pulse signal of a predetermined cycle; a frequency divider including a plurality of frequency division stages so as to frequency divide an output pulse of the pulse generator; pulse subtracting means for subtracting at a predetermined ratio the number of pulses passing through one frequency division stage in the frequency divider; pulse adding means for adding at a predetermined ratio the number of pulses passing through another frequency division stage in the frequency divider; timing setting means for imparting an operation timing to said pulse subtracting means and said pulse adding means and control means including at least an external operation terminal for variably controlling at least one of the adding ratio of said pulse adding means and the subtracting ratio of said pulse subtracting means.

2. A clock pulse generating apparatus according to claim 1, in which said pulse generator comprises a quartz oscillator element, an oscillation stage amplifier connected between both terminals of the quartz oscillator element via an output resistor and having an inverter function, a feedback resistor connected between the input and output terminals of the oscillation stage amplifier and a pair of capacitors serially connected between both terminals of the quartz oscillator element and constituting together with the quartz oscillator element a filter.

3. A clock pulse generating apparatus according to claim 2, in which said oscillation stage amplifier, said feedback resistor and said pair of capacitors are incorporated in an integrating circuit.

4. A clock pulse generating apparatus according to claim 1, in which said external operation terminal is adapted to receive a digital signal.

5. A clock pulse generating apparatus according to claim 1, in which said pulse subtracting means has its pulse subtracting ratio variably controlled by said control means and said pulse adding means has a predetermined pulse adding ratio.

6. A clock pulse generating apparatus according to claim 1, in which said pulse subtracting means has a predetermined pulse subtracting ratio and said pulse adding means has its pulse adding ratio variably controlled by said control means.

7. A clock pulse generating apparatus according to claim 6, in which said pulse subtracting means comprises a first flip-flop having one terminal for receiving an output of a preceding stage of a given frequency division stage and the other terminal for receiving a first timing signal from said timing setting means, a first AND gate for receiving the first timing signal and the output of the first flip-flop, a second flip-flop adapted to be coupled one input thereof to the output of the first AND gate, a second AND gate connected to receive said given frequency stage in the frequency divider and the output of the second flip-flp and having an output terminal connected to the other input terminal of the second flip-flop, and an OR gate connected to receive the output of the second flip-flop and the output of said given frequency stage in the frequency divider and having an output terminal connected to an input terminal of a succeeding stage of said given frequency division stage.

8. A clock pulse generating apparatus according to claim 6, in which said pulse subtracting means comprises a first flip-flop having one terminal for receiving an output of a preceding stage of a given frequency division stage and the other terminal for receiving a first timing signal from said timing setting means, a first AND gate for receiving the first timing signal and the output of the first flip-flop, a second flip-flop adpted to be coupled one input thereof to the output of the first AND gate, a second AND gate connected to receive said given frequency stage in the frequency divider and the output of the second flip-flp and having an output terminal connected to the other input terminal of the second flip-flop, an OR gate having one input terminal connected to receive the output of said given frequency stage in the frequency divider and having an output terminal connected to an input terminal of a succeeding stage of said given frequency division stage, a third AND gate having an output terminal connected to the other input terminal of said OR gate and first and second input terminals, means for coupling the first input terminal of the third AND gate with the output terminal of said second flip-flop and one input terminal of the second AND gate, and means for selectively supplying a digital signal to the second input terminal of the third AND gate.

9. A clock pulse generating apparatus according to claim 8, in which said digital signal selectively supplying means includes a resistor having one end connected to the second input terminal of the third AND gate and the othe end connected to one level source, and an external operating switch connected between the one end of the resistor and the other level source.

10. A clock pulse generating apparatus according to claim 6, in which said pulse adding means comprises a plurality of external operation terminals for receiving digital signals, a plurality of AND gates each having one input terminal connected to the different operation terminal and the other input terminal connected to a different predetermined frequency division stage in the frequency divider, a first OR gate connected to receive outputs of said plurality of AND gates, a first flip-flop having one input terminal for receiving an output of said first OR gate and the other input terminal for receiving a second timing signal from said timing setting means, a first AND gate for receiving the second timing signal and the output of the first flip-flop, a second flip-flop for receiving the output pulse of the pulse generator and generating Q, $\overline{Q}$ outputs, a second AND gate for receiving the $\overline{Q}$ output of the second flip-flop, an output pulse of the pulse generator and an output of the first AND gate, a third AND gate for receiving the output pulse of the pulse generator and the Q output of the second flip-flop, and a second OR gate for receiving an output of the third AND gate and an output of the second AND gate, and for connecting its output to a succeeding frequency division stage.

11. A clock pulse generating apparatus according to claim 1, in which said timing setting means comprises an inverter for receiving an output of a given frequency division stage in said frequency divider, a first AND gate for receiving an output of a preceding stage of said given frequency division stage and an inverter, a second AND gate for receiving an output of said given frequency stage and an output of said preceding stage, and a flip-flop having a readout input terminal for receiving an output of the first AND gate and a read-in input terminal for receiving an output of the second AND gate and adapted to be driven at a predetermined cycle by the output of the frequency divider to generate Q and $\overline{Q}$ outputs.

* * * * *